United States Patent
Li et al.

(10) Patent No.: US 9,190,438 B2
(45) Date of Patent: Nov. 17, 2015

(54) SENSOR AND METHOD FOR FABRICATING THE SAME

(71) Applicant: BEIJING BOE OPTOELECTRONICS TECHNOLOGY CO., LTD., Beijing (CN)

(72) Inventors: Tiansheng Li, Beijing (CN); Shaoying Xu, Beijing (CN); Zhenyu Xie, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/125,830

(22) PCT Filed: Nov. 26, 2012

(86) PCT No.: PCT/CN2012/085290
§ 371 (c)(1),
(2) Date: Dec. 12, 2013

(87) PCT Pub. No.: WO2014/015598
PCT Pub. Date: Jan. 30, 2014

(65) Prior Publication Data
US 2015/0014751 A1    Jan. 15, 2015

(30) Foreign Application Priority Data

Jul. 26, 2012    (CN) .......................... 2012 1 0262973

(51) Int. Cl.
*H01L 27/146*    (2006.01)

(52) U.S. Cl.
CPC .... *H01L 27/14612* (2013.01); *H01L 27/14603* (2013.01); *H01L 27/14632* (2013.01); *H01L 27/14658* (2013.01); *H01L 27/14687* (2013.01); *H01L 27/14689* (2013.01)

(58) Field of Classification Search
CPC .................................................. H01L 29/6675
USPC ....................... 257/444, 72, 60, 79, 59; 438/4
See application file for complete search history.

(56) References Cited

U.S. PATENT DOCUMENTS 7,045,820 B2 *    5/2006  Hayashi et al. ................. 257/79
7,615,731 B2 *   11/2009  Heiler et al. ............... 250/214.1
(Continued)

FOREIGN PATENT DOCUMENTS

CN           102790069 A     11/2012

OTHER PUBLICATIONS

International Search Report Issued May 2, 2013 Appln. No. PCT/CN2012/085290.
(Continued)

*Primary Examiner* — Yu-Hsi D Sun
*Assistant Examiner* — Chi-Hua Yang
(74) *Attorney, Agent, or Firm* — Ladas & Parry LLP

(57) ABSTRACT

A sensor and its fabrication method are provided. The sensor comprises: a base substrate, a group of gate lines and a group of data lines arranged as crossing each other, and a plurality of sensing elements arranged in an array and defined by the group of gate lines and the group of data lines, each sensing element comprising a Thin Film Transistor (TFT) device and a photodiode sensing device, wherein the photodiode sensor device comprises: a bias line disposed on the base substrate; a transparent electrode disposed on the bias line and being electrically contacted with the bias line; a photodiode disposed on the transparent electrode; and a receiving electrode disposed on the photodiode; the TFT device is located above the photodiode. When the sensor is functioning, light is directly transmitted onto the photodiode sensor device through the base substrate. In comparison with conventional technologies, the light loss is largely reduced and the light absorption usage ratio is improved.

13 Claims, 5 Drawing Sheets

(56) References Cited

U.S. PATENT DOCUMENTS

2007/0007458 A1* 1/2007 Mochizuki et al. ...... 250/370.09
2008/0164473 A1* 7/2008 Tai et al. .......................... 257/59
2009/0026509 A1* 1/2009 Hayashi et al. ............... 257/292
2009/0230433 A1* 9/2009 Yamaguchi ................... 257/201
2010/0320391 A1* 12/2010 Antonuk ....................... 250/366
2012/0153173 A1* 6/2012 Chang et al. ............. 250/370.08
2012/0235026 A1* 9/2012 Wu ............................. 250/214 P

OTHER PUBLICATIONS

International Preliminary Report on Patentability Appln. No. PCT/CN2012/085290; Dated Jan. 27, 2015.

* cited by examiner

SENSOR AND METHOD FOR FABRICATING THE SAME

FIELD OF THE ART

Embodiments of the invention relate to a sensor and a method for fabricating the same.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is a sensor.

FIG. 1 illustrates a general configuration of a sensor. The sensor 12 comprises a plurality of scan lines 15, a plurality of data lines 16 and a plurality of sensing elements, each of the sensing elements comprises a photodiode 13 and a field effect transistor (FET) 14. The gate of the FET 14 is connected with a corresponding scan line 15 of the sensor 12, the source of the FET 14 is connected with a corresponding data line 16 of the sensor, and the drain of the FET 14 is connected with the photodiode 13. One end of the date lines 16 is connected to a data readout circuit 18 via a connecting pin 17.

The working principle of the above sensor is as follows: the sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected with the FET 14 and the data readout circuit 18, and capturing of the photocurrent signal is realized by controlling signal timing on the scan line 15 and the data line 16. That is to say, the capturing of the photocurrent signal generated by the photodiode 13 is controlled by controlling the ON/OFF state of the FET 14.

Currently, sensors generally employ a thin film transistor (TFT) plate configuration. Such a sensor may have many layers in its cross section. For example, each sensing element comprises a substrate, a gate electrode layer, a gate insulating layer, an active layer, a source electrode and a drain electrode layer, a passivation layer, PIN junction of a PIN photosensor and transparent electrode window layer, and a bias line layer as well as a light-shield strip layer. Detailed patterning layers may differ from each other for different sensors, depending on the specific configuration of the sensors.

In the conventional configuration of the sensors, light reaches the PIN photodiode after passing through two passivation layers. Due to that the passivation layers are relatively thick, light loss is significant, absorption ratio of light is high, and power consumption is relatively high, making it difficult to improve the image quality.

SUMMARY

The invention aims to provide a sensor and its fabrication method so as to overcome the technical problems of sensors having significant light loss, low absorption usage rate, high power consumption and difficulty in further improving picture quality.

A first aspect of the invention provides a sensor, comprising: a base substrate, a group of gate lines and a group of data lines arranged as crossing each other, and a plurality of sensing elements arranged in an array and defined by the group of gate lines and the group of data lines, each sensing element comprising a Thin Film Transistor (TFT) device and a photodiode sensing device, wherein:

the photodiode sensor device comprises: a bias line disposed on the base substrate; a transparent electrode disposed on the bias line and electrically contacted with the bias line; a photodiode disposed on the transparent electrode; and a receiving electrode disposed on the photodiode;

the TFT device comprises: a source electrode disposed on the photodiode and connected with the receiving electrode, a drain electrode disposed on the photodiode and connected with a neighboring data line, wherein the source electrode and the drain electrode are disposed opposed to each other to form a channel; an ohmic layer disposed on the source electrode and the drain electrode; an active layer disposed on the ohmic layer and the channel; a first passivation layer disposed on the active layer and overlaying the base substrate; and a gate electrode disposed on the first passivation layer and over the channel, wherein the gate electrode is connected with a neighboring gate line.

A further aspect of the invention provides a method for fabricating a sensor comprising:

forming a pattern of a bias line on a base substrate by using a first patterning process;

forming a pattern of a transparent electrode on the bias line and a pattern of a photodiode disposed on the transparent electrode by using a second patterning process, wherein the transparent electrode is electrically contacted with the bias line;

forming a pattern of a receiving electrode on the photodiode, a pattern of a source electrode connected with the receiving electrode, a pattern of a drain electrode disposed opposed to the source electrode to form a channel, a pattern of a data line connected with the drain electrode, and a pattern of an ohmic layer on the source electrode and the drain electrode, by using a third patterning process;

forming a pattern of an active layer on the ohmic layer and the channel, by using a fourth patterning process; and forming a first passivation layer overlaying the whole base substrate, and forming a pattern of a gate line and a pattern of a gate electrode connected with the gate line, by using a fifth patterning process.

In an embodiment, the bias line of the sensor is fabricated as the first layer above the base substrate. As a result, when the sensor is functioning, light is incident from the base substrate. Therefore, the light is directly transmitted onto the photodiode sensor device through the base substrate. In comparison with conventional technologies, the above structure reduces the light loss largely, the light absorption usage ratio is improved and the picture quality is enhanced, while the power consumption is reduced as well.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
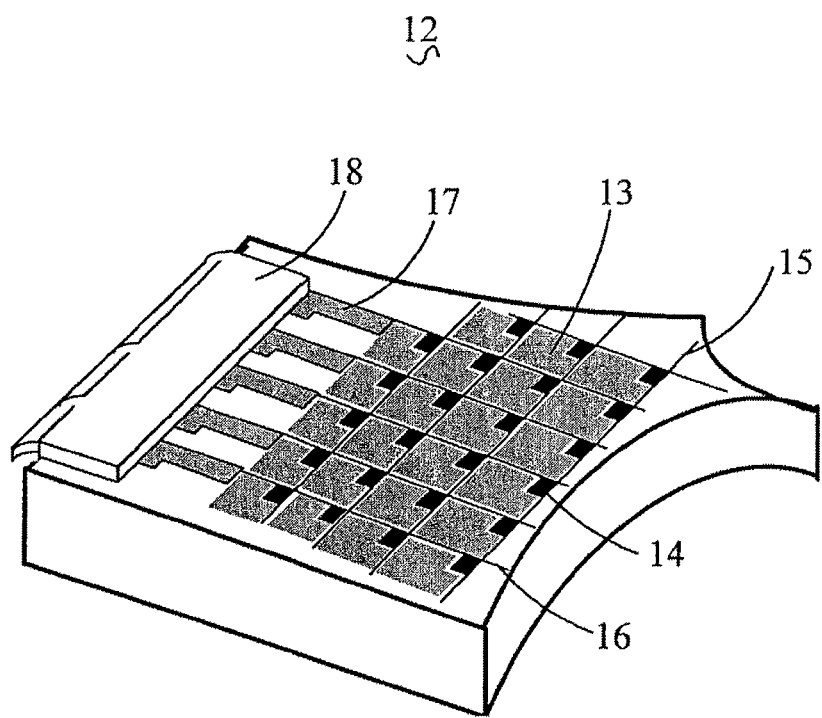
FIG. 1 schematically illustrates a three-dimensional (3-D) configuration of a conventional sensor.

12: sensor; 13: photodiode; 14: FET
15: scan line 16: data line 17: connecting pin
18: data readout circuit 30: gate line 31: data line
32: base substrate 33: source electrode 34: drain electrode
35: ohmic layer 36: active layer 42: bias line
38: gate electrode 39: receiving electrode 40: photodiode
41: transparent electrode 57: second passivation layer 43: first passivation layer
34a: first part 34b: second part

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the following embodiments of the invention, the sensors may comprise many types of sensors such as X-ray sensors and the like. The following description and drawings are directed to a single sensing element; however, other sensing elements may be formed in the same way.

A sensor is provided according to an embodiment of the invention, with an aim of solving the technical problems of conventional sensors having significant light loss, low absorption usage ratio of light, high power consumption and difficulty in improving the image quality.

Figure 2A:
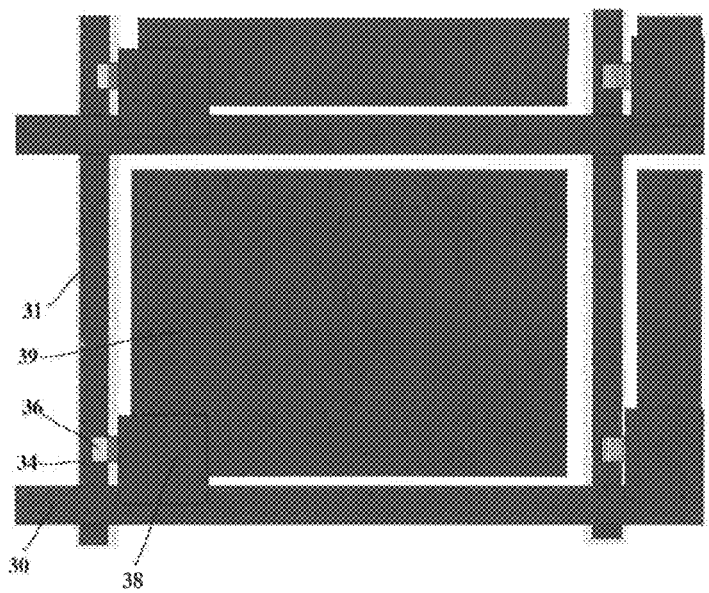
FIG. 2a schematically illustrates a top view of a sensing element (after six patterning processes) of a sensor in accordance with an embodiment of the invention.
Figure 2B:
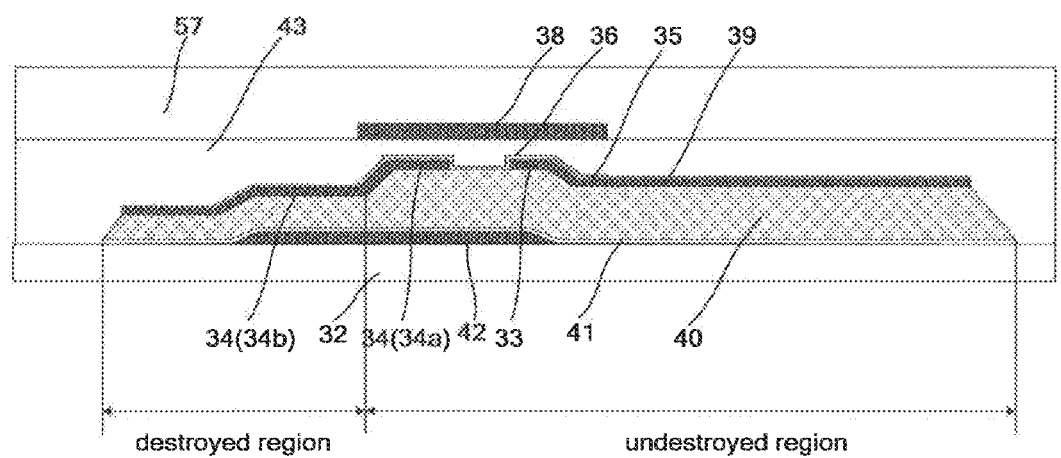
FIG. 2b schematically illustrates a cross section of a sensing element (after six patterning processes) of a sensor in accordance with an embodiment of the invention.

As illustrated in FIGS. 2a and 2b, the sensor in accordance with the embodiment of the invention comprises: a base substrate 32, a group of gate lines 30 and a group of data lines 31 arranged as crossing each other, and a plurality of sensing elements arranged in an array and defined by the group of gate lines 30 and the group of data lines 31. Each sensing element comprises a TFT device and a photodiode sensing device.

Herein, the photodiode sensor device comprises: a bias line 42 disposed on the base substrate 32; a transparent electrode 41 disposed on the bias line 42 and being electrically contacted with the bias line 42; a photodiode (PD) 40 disposed on the transparent electrode 41; and a receiving electrode 39 disposed on the PD 40.

The TFT device comprises: a source electrode 33 disposed on the PD 40 and connected with the receiving electrode 39, a drain electrode 34 disposed on the PD 40 and connected with a neighboring data line 31, wherein the source electrode 33 and drain electrode 34 are disposed opposed to each other to form a channel; an ohmic layer 35 disposed on the source electrode 33 and the drain electrode 34; an active layer 36 disposed on the ohmic layer 35 and over the channel; a first passivation layer 43 disposed on the active layer 36 and overlaying the base substrate; and a gate electrode 38 disposed on the first passivation layer 43 and over the channel, where the gate electrode 38 is connected with a neighboring gate line 30. Here, the first passivation layer 43 of FIG. 2b is disposed on all patterns previously formed on the base substrate and overlays the exposed base substrate. In this sense, the first passivation layer 43 substantially overlays the area of the whole base substrate.

In an embodiment of the invention, the base substrate 32 may be a glass substrate, a plastic substrate or a substrate made of other materials; the gate line 30, the gate electrode 38, the date line 31, the source electrode 33, the drain electrode 34, the receiving electrode 39 and the bias line 42 may be a single layer film made of aluminum neodymium (AlNd) alloy, aluminum (Al), copper (Cu), molybdenum (Mo), molybdenum tungsten (MoW) alloy or chromium (Cr), or a multi-layer film made of any combination of these metal elements or alloy materials. The single layer or multi-layer film may have a thickness of for example 150 nm to 450 nm. A material of the ohmic layer 35 may be a doped semiconductor (n+a-Si); a material of the active layer 36 may be a semiconducting material, such as, amorphous silicon (a-Si), with a thickness of 30 nm to 250 nm; the first passivation layer and a second passivation layer 57 described below may be made of an inorganic insulating film (such as silicon nitrides) or an organic insulating film (such as a photosensitive resin material or a non-photosensitive resin material) with a thickness of, for example, 1000 nm to 2000 nm; a material of the transparent electrode 41 may be transparent conductive materials such as indium tin oxides (ITO) or indium zinc oxides (IZO).

In an embodiment of the invention, the photodiode 40 is preferably a PIN photodiode, due to that a PIN photodiode has the advantages of having small junction capacitance, short transit time and high sensitivity. However, in other embodiments of the invention, the photodiode 40 may be a MIS (Metal-Insulator-Semiconductor)-type photodiode and other types of PD.

In the embodiment of the invention, the bias line 42 is the first layer above the base substrate 32 (that is, the lowest layer above the base substrate). When the sensor is functioning, light is incident from the base substrate. Therefore, the light is directly transmitted onto the photodiode sensor device through the base substrate. In comparison with conventional technologies, the light loss is largely reduced, the light absorption usage ratio is improved and the picture quality is enhanced, while the power consumption is reduced as well. Moreover, in the embodiment of the invention, the bias line 42 is arranged as parallel to the data line 31. However, in other embodiment of the invention, the bias line may be arranged in other ways, such as being parallel to the gate line 30.

Optionally, the sensor of the above embodiment may further comprises a second passivation layer 57 disposed on the gate electrode 38 and overlays the first passivation layer. The second passivation layer 57 has a signal-transmitting region via hole. FIG. 2b only illustrates a cross section of a sensing element of the sensor in accordance with the embodiment of the invention, the signal-transmitting region via hole at the peripheral of the base substrate is therefore not shown. It is seen from FIG. 2b that the second passivation layer 57 overlays the gate electrode 38 and the first passivation layer 43. In this sense, the second passivation layer 57 substantially overlays the area of the whole base substrate.

As illustrated in FIG. 2b, the PD 40 comprises an undestroyed region and a destroyed region, where a thickness of the undestroyed region is larger than that of the destroyed region, such that the part of drain electrode formed on the undestroyed region and the source electrode formed on the destroyed region are of the same height. In an embodiment, the drain electrode 34 comprises a first part 34a and a second part 34b, where the undestroyed region corresponds to a location of the first part 34a, the source electrode 33 and the receiving electrode 39, and the destroyed region corresponds to the location of the second part 34b. More specifically, in an embodiment, the undestroyed region is a part of the PD 40 that is located below the first part 34a of the drain electrode 34, the source electrode and the receiving electrode 39; the destroyed region is a part of the PD 40 that is located below the second part 34b of the drain electrode 34. The above structure not only reduces the terminal difference due to a difference in thickness of the source electrode and the drain electrode generated during the fabrication processes (that is, a difference in height or thickness of respective terminal portions of the source and drain electrodes) but also decreases a defect rate. Moreover, due to the presence of destroyed region in the PD, the interference on the conducting signals of the source and drain electrode is relatively low, which effectively suppress the cross-talk of the TFT device.

In an embodiment of the invention, the source electrode 33, the drain electrode 34, the data line 31 and the receiving electrode 39 may be made of the same or different materials. However, the same material is preferred. In this case, the source electrode 33, the drain electrode 34, the data line 31 and the receiving electrode 39 can be formed using a same and one patterning process, which increases the production efficiency and reduces the production cost.

Figure 3A:
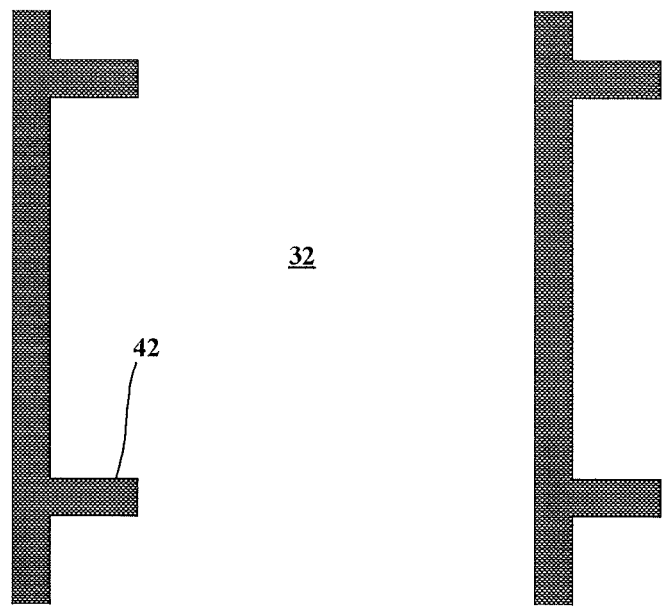
FIG. 3a schematically illustrates a top view after a first patterning process of a fabrication method in accordance with an embodiment of the invention.
Figure 3B:
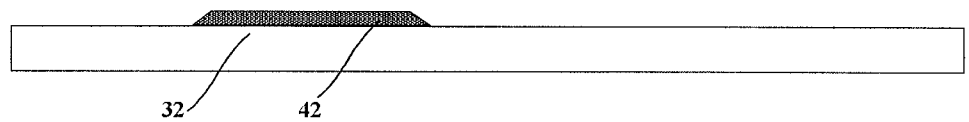
FIG. 3b schematically illustrates a cross section after a first patterning process of a fabrication method in accordance with an embodiment of the invention.

In accordance with another embodiment of the invention, there is provided a method for fabricating the above sensor. The method comprises:

Step 101: a patterning process is used to form, on the base substrate 32, a pattern of the bias line 42. A cross section after the first patterning process is illustrated in FIGS. 3a and 3b.

Generally speaking, a patterning process sequentially comprises steps of substrate cleaning, film forming, photoresist application, exposure, developing, etching, photoresist removal and so on. The substrate may be cleaned using deionized water or an organic cleanser. The film forming process is for forming the structural layers to be patterned. For example, a metal layer is generally formed using Physical Vapor Deposition (PVD), such as magnetron sputtering, and then wet etched to form a pattern. While a non-metal layer is usually formed using Chemical Vapor Deposition (CVD) and then dry etched to form a pattern. Patterning processes in the following steps are the same and will not be described.

Figure 4A:
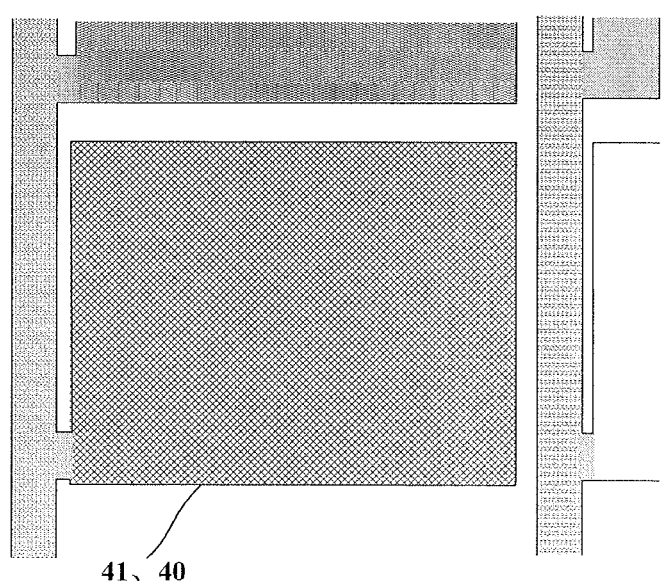
FIG. 4a schematically illustrates a top view after a second patterning process of a fabrication method in accordance with an embodiment of the invention.
Figure 4B:
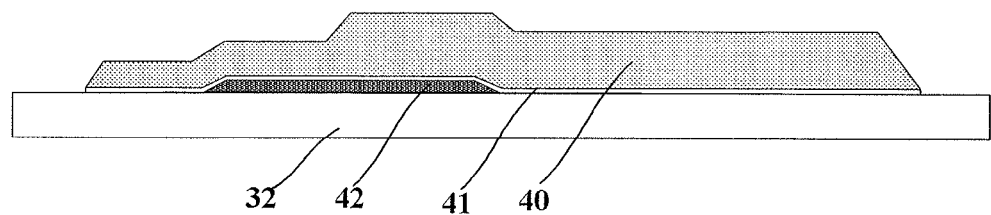
FIG. 4b schematically illustrates a cross section after a second patterning process of a fabrication method in accordance with an embodiment of the invention.

Step 102: a patterning process is used to form a pattern of the transparent electrode 41 which is disposed on the bias line 42 and electrically contacted with the bias line 42, and a pattern of the PD 40 on the transparent electrode 41. A cross section after the second patterning process is illustrated in FIGS. 4a and 4b.

In an embodiment, the step 102 may specifically comprises:

102a: sequentially depositing a transparent conductive material layer and a PD layer, and applying a photoresist on the PD layer;

102b: exposing and developing the photoresist on the base substrate using a mask having a light-transmitting portion, a partial-light-transmitting portion and a light-blocking portion to obtain a photoresist pattern having a photoresist-completely-removed region, a photoresist-partially-removed region and a photoresist-completely-retained region;

102c: etching the photoresist-completely-removed region on the base substrate; and

102d: ashing the photoresist-partially-removed region on the base substrate to remove the photoresist in the photoresist-partially-removed region and retain the photoresist in the photoresist-completely-retained region, and then etching and removing the photoresist to form the pattern of the transparent electrode 41 and the pattern of the PD 40.

In the above description, positive photoresist is used as the example, in which the light-transmitting portion, the partial-light-transmitting portion and the light-blocking portion of the mask are used to expose the photoresist completely, partially and not at all respectively, and the photoresist is developed to obtain the photoresist-completely-retained region, the photoresist-partially-removed region and the photoresist-completely-removed region. The photoresist in the photoresist-completely-retained region is substantially completely retained. In the above step 102b, the light-blocking portion of the mask is used to form the region having the receiving electrode 39, the source electrode 33 and the first part 34a of the drain electrode 34, the partial-light-transmitting portion of the mask is used to form the region having the second part 34b of the drain electrode 34. The used mask is specifically a dual-tone mask (such as a gray-tone mask or a half-tone mask).

The pattern of the PD 40 formed in step 102d comprises an undestroyed region and a destroyed region, where a thickness of the undestroyed region is larger than that of the destroyed region, such that the part of drain electrode formed on the undestroyed region and the source electrode are of the same height. In an embodiment, the drain electrode 34 comprises a first part 34a and a second part 34b, where the undestroyed region corresponds to the location of the first part 34a, the source electrode 33 and the receiving electrode 39, and the destroyed region corresponds to the location of the second part 34b. More specifically, in an embodiment, the undestroyed region is a part of the PD 40 that is located below the first part 34a of the drain electrode 34, the source electrode 33 and the receiving electrode 39; the destroyed region is a part of the PD 40 that is located below the second part 34b of the drain electrode 34. The above structures can reduce the terminal difference due to a difference in thickness of the source electrode and the drain electrode generated in the following step 103, thereby decreasing a defect rate.

Figure 5A:
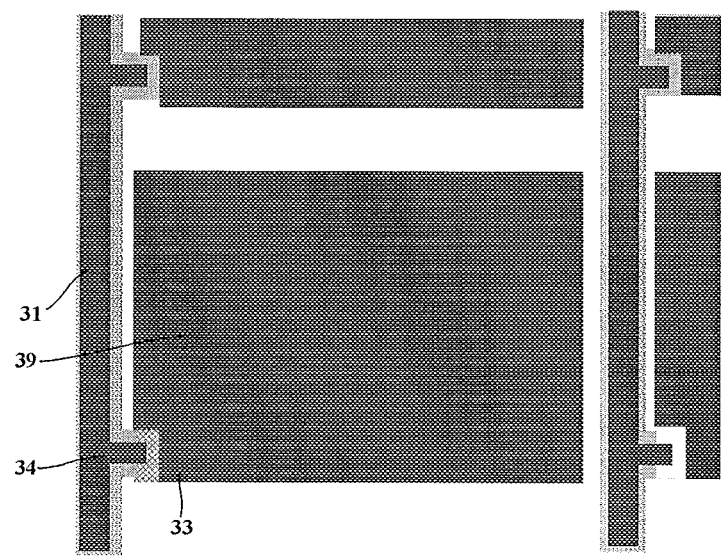
FIG. 5a schematically illustrates a top view after a third patterning process of a fabrication method in accordance with an embodiment of the invention.
Figure 5B:
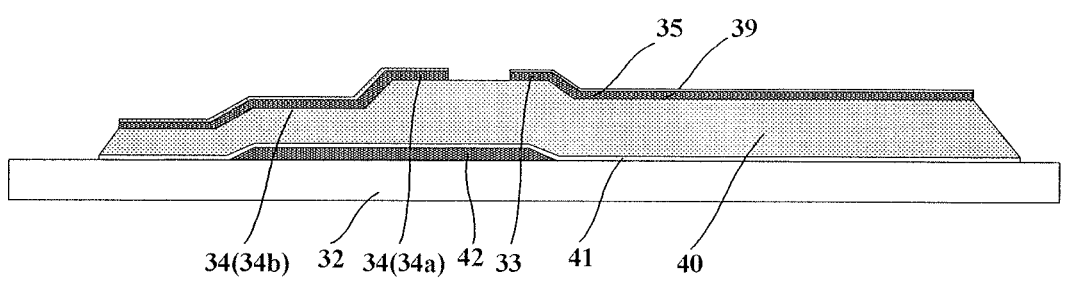
FIG. 5b schematically illustrates a cross section after a third patterning process of a fabrication method in accordance with an embodiment of the invention.

Step 103: a patterning process is used to form a pattern of the receiving electrode 39 on the PD 40, a pattern of the source electrode 33 connected with the receiving electrode 39, a pattern of the drain electrode 34 disposed opposed to the source electrode 33 to form the channel, a pattern of the data line 31 connected with the drain electrode 34, and a pattern of the ohmic layer 35 on the source electrode 33 and the drain electrode 34. A cross section after the third patterning process is illustrated in FIGS. 5a and 5b.

Here, in an embodiment, the source electrode 33, the drain electrode 34, the data line 31 and the receiving electrode 39 may be made of the same material and thus formed through a single deposition and etching process, which makes the fabrication process simple and the production efficiency high.

Figure 6A:
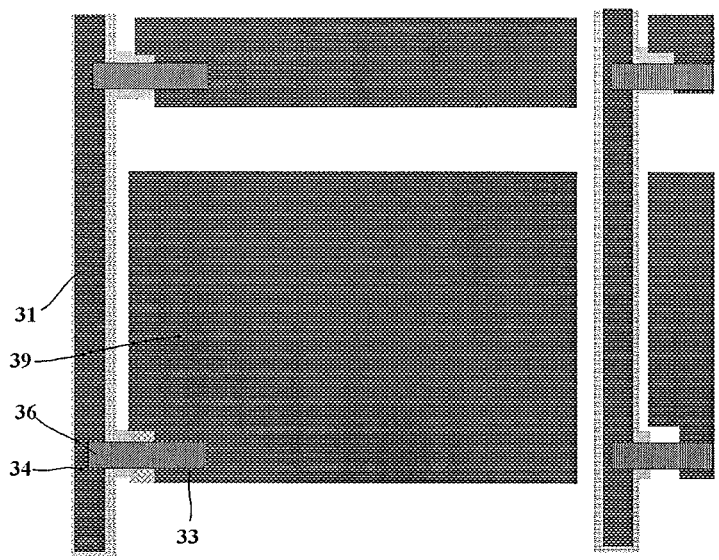
FIG. 6a schematically illustrates a top view after a fourth patterning process of a fabrication method in accordance with an embodiment of the invention.
Figure 6B:
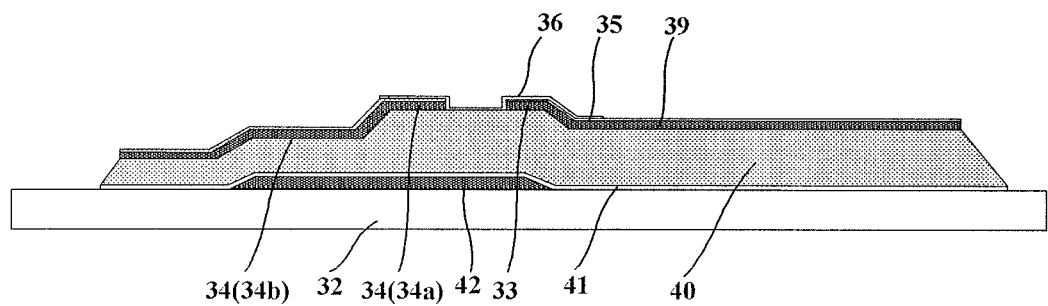
FIG. 6b schematically illustrates a cross section after a fourth patterning process of a fabrication method in accordance with an embodiment of the invention.

Step 104: a patterning process is used to form a pattern of the actively layer 36 on the ohmic layer 35 and the channel. A cross section after the fourth patterning process is illustrated in FIGS. 6a and 6b.

Step 105: forming the first passivation layer 43 overlaying the base substrate, and a patterning process is used to form a pattern of the gate line 30 and a pattern of the gate electrode 38 connected with the gate line 30. The first passivation layer 43 is formed over all the patterns on the base substrate and overlays the exposed base substrate. Thus the first passivation layer 43 substantially overlays the area of the whole base substrate.

Optionally, the method may further comprises the following step after step 105:

Step 106: a patterning process is used to form a pattern of the second passivation layer 57 overlaying the base substrate, where the second passivation layer 57 has a signal-transmitting region via hole (located at the peripheral of the substrate and not shown in the figure). The second passivation layer 57 is formed on the gate electrode 38 and the first passivation layer 34, thus the second passivation layer 57 substantially overlays the area of the whole base substrate. The sensor of the sensing element as illustrated in FIGS. 2a and 2b is finally formed after the afore-mentioned six patterning processes.

It is seen that the above fabrication method for the sensor in accordance with the embodiment of the invention uses six patterning processes in total. In comparison with the prior art, it reduces the number of masks as well as the production cost and simplifies the production process, thereby significantly improves the production capacity and the defect-free rate. Moreover, when the fabricated sensor is functioning, light is directly transmitted onto the photodiode sensor device through the base substrate. In comparison with conventional technologies, the light loss is largely reduced, the light absorption usage ratio is improved and the picture quality is enhanced, while the power consumption is reduced as well.

What are described above is related to the illustrative embodiments of the disclosure only and not limitative to the scope of the disclosure; the scopes of the disclosure are defined by the accompanying claims.

What is claimed is:

1. A sensor, comprising: a base substrate, a group of gate lines and a group of data lines arranged as crossing each other, and a plurality of sensing elements arranged in an array and defined by the group of gate lines and the group of data lines, each sensing element comprising a photodiode sensing device and a TFT device, wherein:

the photodiode sensor device comprises: a bias line disposed on top of and in contact with the base substrate; a transparent electrode disposed on top of the bias line and physically and electrically contacted with the bias line; a photodiode disposed on top of and in contact with the transparent electrode; and a receiving electrode disposed on the photodiode;

the TFT device comprises: a source electrode disposed on top of and in contact with the photodiode and connected with the receiving electrode, a drain electrode disposed on top of and in contact with the photodiode and connected with a neighboring data line, wherein the source electrode and the drain electrode are disposed opposed to each other to form a channel; an ohmic layer disposed on the source electrode and the drain electrode; an active layer disposed on the ohmic layer and the channel; a first passivation layer disposed on the active layer and overlaying the base substrate; and a gate electrode disposed on the first passivation layer and over the channel, wherein the gate electrode is connected with a neighboring gate line; and wherein the photodiode comprises an undestroyed region and a destroyed region, wherein a thickness of the photodiode in the undestroyed region is larger than that of the photodiode in the destroyed region, such that the drain electrode formed on the undestroyed region and the source electrode are of the same height.

2. The sensor of claim 1, further comprising a second passivation layer disposed on the gate electrode and overlaying the base substrate, wherein the second passivation layer has a signal-transmitting region via hole.

3. The sensor of claim 1, wherein the drain electrode comprises a first part and a second part, where the undestroyed region of the photodiode corresponds to a location of the first part of the drain electrode, the source electrode and the receiving electrode, and the destroyed region of the photodiode corresponds to a location of the second part of the drain electrode.

4. The sensor of claim 3, wherein the undestroyed region is a part of the photodiode that is located below the first part of the drain electrode, the source electrode and the receiving electrode; the destroyed region is a part of the photodiode that is located below the second part of the drain electrode.

5. The sensor of claim 1, wherein the bias line is disposed as being parallel to the data line.

6. The sensor of claim 1, wherein the photodiode is a PIN photodiode.

7. The sensor of claim 1, wherein the source electrode, the drain electrode, the data line and the receiving electrode are made of the same material.

8. A method for fabricating a sensor, comprising:

forming a pattern of a bias line on a base substrate by using a first patterning process;

forming a pattern of a transparent electrode on the bias line and a pattern of a photodiode on the transparent electrode by using a second patterning process, wherein the transparent electrode is electrically contacted with the bias line;

forming a pattern of a receiving electrode on the photodiode, a pattern of a source electrode connected with the receiving electrode, a pattern of a drain electrode disposed opposed to the source electrode to form a channel, a pattern of a data line connected with the drain electrode, and a pattern of an ohmic layer on the source electrode and the drain electrode, by using a third patterning process;

forming a pattern of an active layer on the ohmic layer and the channel, by using a fourth patterning process; and forming a first passivation layer overlaying the whole base substrate, and forming a pattern of a gate line and a pattern of a gate electrode connected with the gate line by using a fifth patterning process,
wherein the pattern of the photodiode comprises an undestroyed region and a destroyed region, wherein a thickness of the undestroyed region is larger than that of the destroyed region, such that the drain electrode subsequently formed on the undestroyed region and the source electrode are of the same height.

9. The method of claim 8, further comprising the following step after forming the pattern of the gate line and the pattern of the gate electrode connected with the gate line by using a fifth patterning process:
forming a pattern of a second passivation layer overlaying the whole base substrate by using a sixth patterning process, wherein the second passivation layer has a signal-transmitting region via hole.

10. The method of claim 8, wherein the step of forming the pattern of the transparent electrode and the pattern of the photodiode by using the second patterning process comprises:
sequentially depositing a transparent conductive material layer and a photodiode layer, and applying a photoresist on the photodiode layer;
exposing and developing the photoresist on the base substrate by using a mask having a light-transmitting portion, a partial-light-transmitting portion and a light-blocking portion to obtain a photoresist pattern having a photoresist-completely-removed region, a photoresist-partially-removed region and a photoresist-completely-retained region, wherein the light-blocking portion is used to form the receiving electrode, the source electrode and a first part of the drain electrode, the partial-light-transmitting portion is used to form a second part of the drain electrode;
etching the photoresist-completely-removed region on the base substrate; and
asking the photoresist-partially-removed region on the base substrate to remove the photoresist in the photoresist-partially-removed region and retain the photoresist in the photoresist-completely-retained region, and then etching and removing the photoresist to form the pattern of the transparent electrode and the pattern of the photodiode.

11. The method of claim 8, wherein the undestroyed region of the photodiode corresponds to a location of the first part of the drain electrode, the source electrode and the receiving electrode, and the destroyed region of the photodiode corresponds to a location of the second part of the drain electrode.

12. The method of claim 11, wherein the undestroyed region is a part of the photodiode that is located below the first part of the drain electrode, the source electrode and the receiving electrode; the destroyed region is a part of the photodiode that is located below the second part of the drain electrode.

13. The method of claim 9, wherein the source electrode, the drain electrode, the data line and the receiving electrode are made of the same material.

* * * * *